United States Patent [19]

Chaprnka et al.

[11] B  3,989,998
[45]  Nov. 2, 1976

[54] WIDE RANGE PULSE GENERATOR

[75] Inventors: Anthony G. Chaprnka, Cockeysville; Patrick J. McKenzie, Baltimore, both of Md.

[73] Assignee: Westinghouse Electric Corporation, Pittsburgh, Pa.

[22] Filed: Aug. 8, 1974

[21] Appl. No.: 495,759

[44] Published under the second Trial Voluntary Protest Program on February 3, 1976 as document No. B 495,759.

[52] U.S. Cl. .................................. 321/61; 307/108
[51] Int. Cl.² ........................................... H02M 5/00
[58] Field of Search ........... 307/108; 320/1; 321/61, 321/66, 45

[56] References Cited
UNITED STATES PATENTS

| | | | |
|---|---|---|---|
| 3,290,581 | 12/1966 | Hooper | 321/45 R |
| 3,316,476 | 4/1967 | Olson et al. | 321/45 R |
| 3,319,147 | 5/1967 | Mapham | 321/45 R X |
| 3,465,231 | 9/1969 | Hyde | 321/45 R X |
| 3,543,130 | 11/1970 | Rennders | 321/18 X |
| 3,788,228 | 1/1974 | Wilson | 320/1 X |

*Primary Examiner*—William M. Shoop
*Attorney, Agent, or Firm*—M. P. Lynch

[57] ABSTRACT

A pulse generator for generating pulses over a wide range without changing scales is disclosed. The pulse generator is capable of generating pulses in the range from 0.5 Hz to greater than 2 MHz in one continuous range. The wide range of operation is achieved by a timing capacitor which is charged at a logarithmic rate with respect to a frequency determining voltage input signal. This permits a wide frequency range to be covered with a reasonable range of the voltage input signal.

10 Claims, 2 Drawing Figures

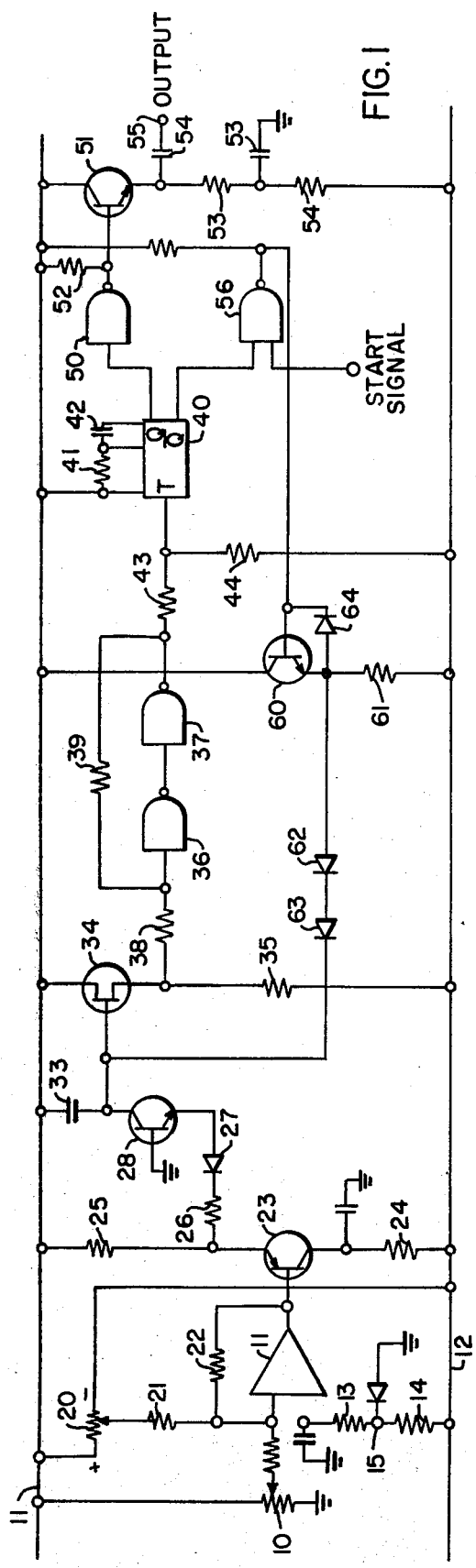
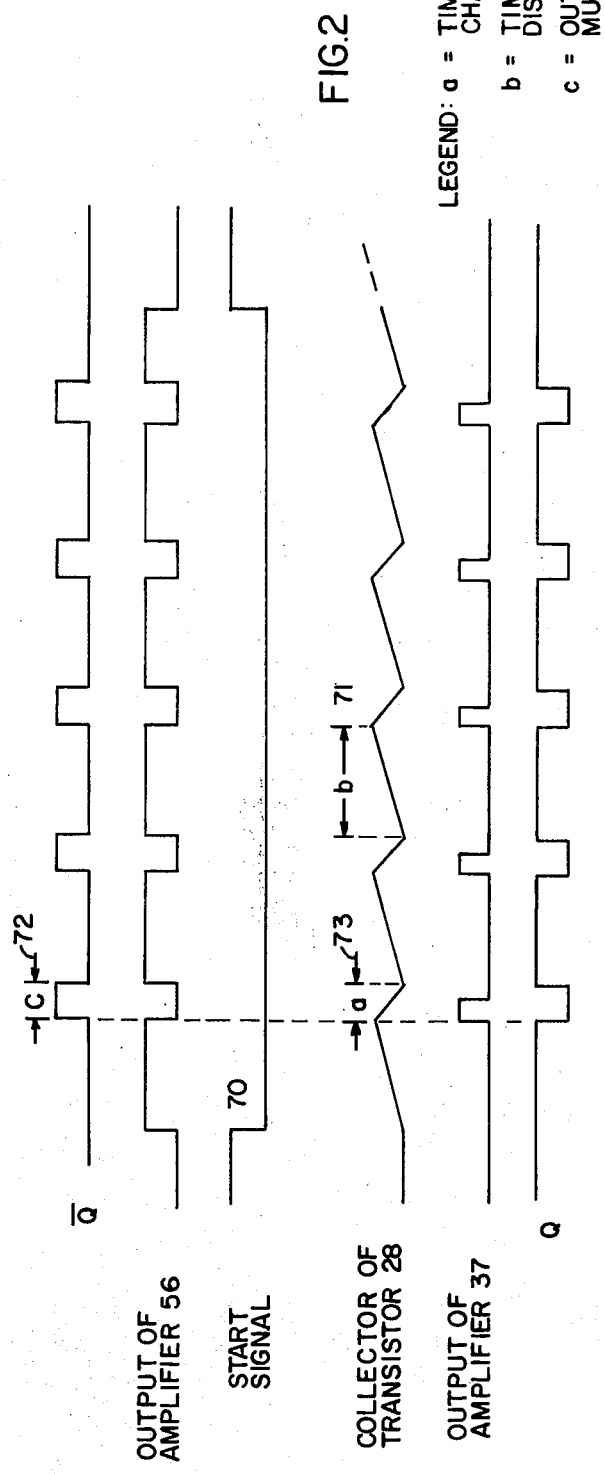

WIDE RANGE PULSE GENERATOR

BACKGROUND OF THE INVENTION

Field of the Invention

The invention relates to pulse generators and more particularly to wide range voltage controlled pulse generators.

SUMMARY OF THE INVENTION

The pulse generator provides a wide frequency range by using a timing capacitor which is charged with a current having a logarithmic relationship to a voltage specifying the frequency. The voltage across the capacitor is coupled to a voltage level sensing circuit which has a field effect transistor input stage. The field effect transistor input stage reduces timing changes due to the current input requirements of the voltage sensitive circuit. The lower frequency limit of the circuit is determined by the leakage current requirements of the voltage sensing circuit. The upper frequency range of the generator is determined by the size of the timing capacitor, the current capability of the current source for charging and discharge time for the capacitor.

The output signal of the voltage sensing circuit is coupled to a non-retriggerable multivibrator to generate an output pulse having a constant width. The output pulse of the multivibrator is coupled back through a discharge circuit to discharge the timing capacitor thereby causing the circuit to oscillate. The discharge circuit also includes a gate permitting the discharge circuit to be interrupted thereby causing the oscillator to stop.

DESCRIPTION OF THE DRAWINGS

FIG. 1 is a schematic diagram of the pulse generator.
FIG. 2 is a series of waveforms illustrating the operation of the pulse generator.

DETAILED DESCRIPTION

FIG. 1 is a schematic diagram of the pulse generator which is the subject of this application. The illustrated circuit is capable of providing a pulse signal having a frequency range from 0.5 Hz to approximately 2 MHz. The frequency is determined by the setting of a potentiometer 10.

The two fixed arms of potentiometer 10 are respectively coupled to the positive bus 11 of the circuit and ground. The movable arms are coupled to the negative (inverting) input of an amplifier 11. The positive (non inverting) input terminal of amplifier 11 is coupled to the negative bus 12 through a bias network comprising two resistors 13 and 14 and a diode 15. Diode 15 serves the purpose of compensating the output voltage of amplifier 11 for changes in temperature.

A second potentiometer 20 is coupled between the positive bus 11 and the negative bus 12. The movable arm of this potentiometer 20 is coupled through a resistor 21 to the negative input of amplifier 11. This potentiometer is adjusted to compensate for the offset voltage of amplifier 11. A feedback resistor 22 is coupled between the output terminal of amplifier 11 and the negative input terminal of this amplifier. This circuit arrangement provides a voltage at the output terminals of amplifier 11 which is a predetermined function of the setting of the frequency determined in potentiometer 11. This voltage is used to control a current source for charging a timing capacitor 33.

The output of amplifier 11 is coupled to the base terminal of a transistor 23 which functions as a current source. The collector of this transistor is coupled through a resistor 24 to the negative voltage bus 12. The emitter of transistor 23 is coupled through a second resistor 25 to the positive bus 11 of the current generator. The emitter is also coupled through the series combination of a resistor 26 and a diode 27 to the emitter of a transistor 28. The base of transistor 28 is coupled to ground. This arrangement causes the emitter of transistor 23 to be substantially equal to the output voltage of amplifier 11 and causes a current to flow in the emitter and collector leads of transistor 28 which is determined by the potential at the emitter of transistor 23. This voltage is in turn a function of the output voltage of the frequency controlling potentiometer 10.

The base to emitter potential of transistor 28 and the voltage drop across diode 27 are logarithmic functions of the current flowing through the diode 27 and in the emitter lead of the transistor 28. The current in the emitter of transistor 28 is in turn determined by the voltage drop between the base of this transistor and the emitter lead of transistor 23. This causes the current flowing in the emitter and collector circuits of transistor 28 to be a logarithmic function of the output voltage of potentiometer 10. The magnitude of the current flowing in the collector of transistor 28 detemines the frequency of the pulse generator; therefore, the frequency becomes a logarithmic function of the output voltage of potentiometer 10. This gives the circuit the previously discussed wide range.

The frequency of the pulse generator is determined by the size of the timing capacitor 33 and the rate at which this capacitor is charged by the constant current source as previously discussed. The junction of the collector of transistor 28 and the timing capacitor 33 is coupled to the gate terminal of a field effect transistor 34. The source of the field effect transistor 34 is coupled through a resistor 35 to the negative bus 12 of the pulse generator. The drain terminal of this transistor is coupled directly to the positive bus 11. Two series coupled inverting amplifiers in conjunction with an input resistor 38 and a feedback resistor 39 form a Schmitt trigger with the input coupled to the source terminal of the field effect transistor 34. The output signal of the Schmitt trigger is coupled to a one-shot, non-retriggerable multivibrator 40. A series resistor capacitor combination 41 and 42 form a timing network for the multivibrator 40 while resistors 43 and 44 provide bias for the input to the circuit.

The multivibrators 40 provide two output signals which are the complement of each other. The first output designated Q is coupled through an inverting amplifier 50 and a transistor operated as an emitter follower 51. A resistor 52 provides base bias current for transistor 51 while resistors 53 and 54 provide emitter bias for this transistor. Resistor 54 is bypassed by a capacitor 53. An isolation capacitor 55 couples the emitter of transistor 51 to the output terminal 55.

The second output of multivibrator 40 designated Q and a start signal is coupled to the two input terminals of an inverting gate circuit 56. The output terminal of the inverting gate 56 is coupled to the base terminal of a discharge transistor 60. The collector terminal of this transistor is coupled to the negative bus 11 while the emitter is coupled to the positive bus 12 by a resistor 61. A voltage is generated at the emitter of this transistor to discharge the timing capacitor 33. This voltage is coupled to the junction of the collector of transistor 28 and the timing capacitor 33 through two series coupled diodes 62 and 63. High negative base-to-emitter voltages in transistors 60 is prevented by a diode 64.

The detail operation of the pulse generator will now be explained with reference to FIG. 2 which is a diagram showing the waveforms at various points in the pulse generator illustrated in FIG. 1. The start signal coupled to amplifier 56 is illustrated at reference numeral 70 of FIG. 2. The pulse generator is inoperative when the signal is high and starts immediately when this signal goes low. To illustrate the operation of the circuit, FIG. 2 is drawn such that the start signal begins at its high level, changes to its low level and back to its high level. So long as the start signal remains high, the output of gate 56 will remain low, turning off the discharge transistor 50. This permits the current flowing through transistor 28 to charge up the timing capacitor 33 causing the voltage at the collector of transistor 28 to decrease to a low value. When the start signal changes from its high to low values the output signal of gate 56 goes high causing the emitter of transistor 60 to go high. This high voltage is coupled through the series combination of diodes 62 and 63 to the collector of transistor 28 and discharges the timing capacitor 33. This causes the voltage at the collector of transistor 28 to increase. A typical discharge time is defined by period B illustrated at reference numeral 71 of FIG. 2. This period continues until the voltage at the gate of the field effect transistor 34 is sufficient to cause the input to the Schmitt trigger formed by amplifiers 36 and 37 to trigger. When this circuit triggers, the output of amplifier 37 goes to its high value. This transition in the output signal of amplifier 37 also triggers the one-shot multivibrator 40 to generate two signals at the output of the circuit. These signals are labeled Q and Q in FIG. 2. The period C illustrated at reference numeral 72 of FIG. 2 is determined by the timing circuit component resistors 41 and capacitor 42. The Q signal is coupled to the second input of gating circuit 56 causing the output of this circuit to go low. A low output signal from gate 56 turns off the discharge transistor 60 and permits the timing capacitor to begin charging in a negative direction due to the current flow through transistor 28. This charging period is designated as A in FIG. 2 and illustrated at reference numeral 73. Once the timing capacitor 33 has charged to a point where the low threshold of the trigger circuit comprising amplifiers 36 and 37 is reached the output signal of amplifier 37 goes low. After the output of amplifier 37 has gone low and the pulse generated by the one-shot multivibrator 40 has terminated the output of gate 36 again goes high and the timing capacitor 33 is being discharged. This cycle repeats until the start signal goes high.

The Q output of the one-shot multivibrator 40 is amplified by a buffer amplifier 50 and an emitter follower amplifier 51 to produce a high power output signal. The output of the emitter follower transistor 51 is coupled to the output terminal 55 through a capacitor 54 for isolation purposes. A bypass capacitor 53 bypasses bias resistor 54 to supply a substantially constant bias voltage to the emitterfollower output stage.

The entire circuit illustrated in FIG. 1 can be constructed using commerically available components. The multivibrator 40 may be type No. SN54121J manufactured by Texas Instruments. Diodes 62 and 63 are preferably selected such that one diode is a diode having fast switching characteristics and the other diode has low leakage. The leakage of these diodes places a lower limit on the charging current for timing capacitor 33 and thereby places a limit on the lowest frequency which can be generated. The switching time determines the upper rate at which the timing capacitor 33 can be charged and discharged thereby determining the high range of the circuit. Selecting these diodes as described gives the circuit good high and low frequency characteristics.

We claim:
1. A pulse generator comprising:
   an exponential voltage to current converter means adapted to respond to a DC input voltage level by producing an output current which is an exponential function of said DC input voltage level;
   a first circuit means operatively connected to said exponential voltage to current converter means and responding to said output current by changing the charge state of a capacitor in a first direction;
   second circuit means operatively connected to said first circuit means for generating an output pulse in response to a predetermined level of charge of said capacitor, and
   third circuit means for changing the charge state of said capacitor in a second direction in response to said pulse.

2. A pulse generator as claimed in claim 1 wherein said third circuit means functions as a reset circuit means to re-establish the charge state of said capacitor for the generation of a second output pulse in response to said DC input voltage level, the frequency of the output pulses produced by said second circuit means being a function of the DC input voltage level supplied to said exponential voltage to current converter circuit means.

3. A pulse generator as claimed in claim 1 further including a first diode and a second diode connected in a series arrangement and operatively connected to provide isolation between said third circuit means and said capacitor, said first diode being a low leakage diode and said second diode being a fast switching diode.

4. A pulse generator comprising:
   a first circuit for changing the charge state of a capacitor in a first direction;
   a voltage sensitive circuit for generating a signal having at least two levels, said first and second levels of said signal indicating first and second charge conditions of said capacitor;
   a pulse circuit for generating a pulse in response to said signal; and
   a second circuit for changing the charge state of said capacitor in a second direction in response to said pulse, said second circuit including a gate circuit for disabling said pulse generator.

5. A pulse generator in accordance with claim 4 further including isolation means for selectively isolating said second circuit from said capacitor.

6. A pulse generator in accordance with claim 5 wherein said pulse circuit generates a pulse of predetermined duration.

7. A pulse generator in accordance with claim 6 further including a circuit for amplifying the output signal of said pulse circuit to generate a pulse output signal.

8. A pulse generator comprising:
- a first circuit for changing the charge state of a capacitor in a first direction;
- a voltage sensitive circuit for generating a signal having at least two levels, said first and second levels of said signal indicating first and second charge conditions of said capacitor; said voltage sensitive circuit including a field effect input stage to minimize the change in the charge state of said capacitor by said voltage sensitive circuit;
- a pulse circuit for generating a pulse in response to said signal; and
- a second circuit for changing the charge state of said capacitor in a second direction in response to said pulse.

9. A pulse generator in accordance with claim 8 wherein said voltage sensitive circuit includes a Schmitt trigger circuit formed by cascading two inverting amplifiers and a feedback circuit around said cascaded combination.

10. A pulse generator in accordance with claim 9 wherein the output of said field effect stage is coupled to the input of said Schmitt trigger circuit.

* * * * *